(12) United States Patent
Toyomasu et al.

(10) Patent No.: US 10,373,845 B2
(45) Date of Patent: Aug. 6, 2019

(54) SUBSTRATE CLEANING APPARATUS AND SUBSTRATE CLEANING METHOD

(71) Applicant: EBARA CORPORATION, Tokyo (JP)

(72) Inventors: Fujihiko Toyomasu, Tokyo (JP); Toru Maruyama, Tokyo (JP); Mitsunori Komatsu, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 14/080,685

(22) Filed: Nov. 14, 2013

(65) Prior Publication Data
US 2014/0216505 A1  Aug. 7, 2014

(30) Foreign Application Priority Data

Nov. 15, 2012  (JP) .................................. 2012-250960

(51) Int. Cl.
H01L 21/67  (2006.01)

(52) U.S. Cl.
CPC .. H01L 21/67017 (2013.01); H01L 21/67051 (2013.01)

(58) Field of Classification Search
CPC ........... H01L 21/67017; H01L 21/6704; H01L 21/67051; H01L 21/02041–02101
See application file for complete search history.

(56) References Cited

U.S. PATENT DOCUMENTS

| | | | | |
|---|---|---|---|---|
| 5,950,645 A | * | 9/1999 | Olesen | B08B 3/12 134/100.1 |
| 6,240,933 B1 | * | 6/2001 | Bergman | B08B 3/08 134/1.3 |
| 2003/0172955 A1 | * | 9/2003 | Kuroda et al. | 134/2 |
| 2004/0045592 A1 | * | 3/2004 | Yamamoto | 134/157 |
| 2004/0261817 A1 | * | 12/2004 | Araki | H01L 21/67051 134/2 |
| 2009/0078287 A1 | * | 3/2009 | Kamikawa | B08B 3/00 134/18 |

FOREIGN PATENT DOCUMENTS

| | | |
|---|---|---|
| JP | S56-026536 A | 3/1981 |
| JP | H10-070101 A | 3/1998 |
| JP | 10-144642 A | 5/1998 |

(Continued)

OTHER PUBLICATIONS

JP2008277576—Machine Translation, Nov. 2008.*
JP2001338903—Machine Translation, Dec. 2001.*
JP2007311559—Machine Translation (Year: 2007).*

*Primary Examiner* — Marc Lorenzi
(74) *Attorney, Agent, or Firm* — Baker & Hostetler LLP (57) ABSTRACT

A substrate cleaning apparatus includes: a pure water supply line provided with a pure water flow regulator and a pure water supply valve; chemical supply lines each provided with a chemical flow regulator and a chemical supply valve; a merging line where pure water and a plurality of liquid chemicals meet to form a cleaning liquid; a cleaning liquid supply line configured to supply the cleaning liquid to a substrate; and a controller configured to control the pure water flow regulator, the pure water supply valve, the chemical flow regulators, and the chemical supply valves such that the pure water and the plurality of liquid chemicals are present at a predetermined ratio at a meeting point.

5 Claims, 10 Drawing Sheets

(56) References Cited

FOREIGN PATENT DOCUMENTS

| | | | |
|---|---|---|---|
| JP | H11-114474 | A | 4/1999 |
| JP | 2001-338903 | | 7/2001 |
| JP | 2004-281464 | A | 10/2004 |
| JP | 2007311559 | A * | 11/2007 |
| JP | 2008-277576 | | 11/2008 |
| JP | 2009-098128 | A | 5/2009 |
| JP | 2010-067636 | A | 3/2010 |

* cited by examiner

SUBSTRATE CLEANING APPARATUS AND SUBSTRATE CLEANING METHOD

CROSS REFERENCE TO RELATED APPLICATIONS

This document claims priority to Japanese Patent Application Number 2012-250960, filed Nov. 15, 2012, the entire contents of which are hereby incorporated by reference.

BACKGROUND OF THE INVENTION

Field of the Invention:

The present invention relates to a substrate cleaning apparatus and a substrate cleaning method for cleaning a surface of a substrate, such as a semiconductor wafer, and more particularly to a substrate cleaning apparatus and a substrate cleaning method for use in a substrate cleaning process for cleaning a substrate surface after a polishing process, such as CMP. The substrate cleaning apparatus and the substrate cleaning method of the present invention can also be applied to a cleaning process in manufacturing a flat panel, an image sensor, such as CMOS or CCD, and a magnetic film of an MRAM.

Description of the Related Art:

A damascene interconnect forming process is a process of forming interconnects by filling a metal into interconnect trenches formed in a dielectric film on a substrate surface. After the formation of the interconnects, an excessive metal on the substrate surface is removed by chemical mechanical polishing (CMP). Residues of slurry, polishing debris, etc. are present on the substrate surface after CMP. Therefore, it is necessary to remove such residues (particles), remaining on the substrate surface after CMP, and metal impurities formed on the substrate surface.

An SC-1 cleaning process (or Standard Clean 1), which is intended to mainly remove particles, is known as a substrate cleaning method of cleaning a substrate surface that has been subjected to the CMP. This SC-1 cleaning process uses a cleaning liquid (an SC-1 cleaning liquid) comprising ammonia water and a hydrogen peroxide solution diluted with pure water to a predetermined concentration. Further, an SC-2 cleaning process (or Standard Clean 2), which is intended to mainly remove metal impurities, is known. This SC-2 cleaning process uses a cleaning liquid (an SC-2 cleaning liquid) comprising hydrochloric acid and a hydrogen peroxide solution diluted with pure water to a predetermined concentration.

In an example, when carrying out the SC-1 cleaning process, pure water, ammonia water and a hydrogen peroxide solution are stored in a tank at a predetermined ratio, and the cleaning liquid in the tank is supplied to a substrate by a pump while agitating the cleaning liquid by means of a pump or an agitating plate so as to uniformly mix the pure water, the ammonia water and the hydrogen peroxide solution.

However, such a so-called "tank method" that employs a tank for storing a cleaning liquid, not only needs an installation space for the tank which generally has a large volume, but also needs pipes that connect the tank with processing liquid supply sources, pumps for pumping processing liquids, and other equipment, thus requiring use of a complicated large-scale apparatus.

An in-line substrate cleaning method, which does not use such a tank, has been proposed. For example, Japanese Laid-Open Patent Publication No. 2001-338903 discloses a method which involves supplying a liquid mixture (cleaning liquid), comprising a mixture of a plurality of processing liquids ($NH_4OH$, $H_2O_2$ and pure water), to a substrate to process the substrate. In this method, the processing liquids are supplied to a substrate in such an order as to cause less damage to the substrate, e.g., in the order of pure water, $H_2O_2$ and $NH_4OH$. Further, Japanese Laid-Open Patent Publication No. 2008-277576 discloses a substrate cleaning method in which a cleaning liquid is produced by diluting a liquid mixture, comprising ammonia water or hydrochloric acid and a hydrogen peroxide solution, with pure water, and the cleaning liquid is supplied directly to a substrate.

When cleaning a substrate surface by supplying the cleaning liquid (the SC-1 cleaning liquid) comprising ammonia water and a hydrogen peroxide solution, diluted with pure water to a predetermined concentration, to the substrate surface, it is preferred in the light of uniform processing (cleaning) to use a cleaning liquid in which pure water, ammonia water and a hydrogen peroxide solution are kept uniformly mixed at a constant ratio, and to continuously supply such a cleaning liquid to the substrate from the start of the cleaning process. If there is a difference in the concentration of component, e.g., hydrogen peroxide solution, in the cleaning liquid, a reaction mark may be produced on the substrate.

However, it has been generally difficult in the in-line cleaning method to continuously supply a cleaning liquid, comprising pure water, ammonia water and a hydrogen peroxide solution, to a substrate while keeping the components of the cleaning liquid uniformly mixed at a constant ratio from the start of cleaning the substrate.

SUMMARY OF THE INVENTION

The present invention has been made in view of the above situation. It is therefore an object to provide a substrate cleaning apparatus and a substrate cleaning method of in-line type which make it possible to clean a substrate by continuously supplying a cleaning liquid, comprising pure water and a plurality of liquid chemicals, to the substrate while keeping the components of the cleaning liquid uniformly mixed at a constant ratio from the start of the substrate cleaning.

In order to achieve the object, a first embodiment of the present invention provides a substrate cleaning apparatus for cleaning a substrate by supplying a cleaning liquid, containing a plurality of liquid chemicals diluted with pure water, to the substrate, said apparatus comprising: a pure water supply line provided with a pure water flow regulator and a pure water supply valve; a plurality of chemical supply lines each provided with a chemical flow regulator and a chemical supply valve; a merging line where pure water flowing through the pure water supply line and a plurality of liquid chemicals flowing through the plurality of chemical supply lines meet to form a cleaning liquid; a cleaning liquid supply line configured to supply the cleaning liquid to a substrate; and a controller configured to control the pure water flow regulator, the pure water supply valve, the chemical flow regulators, and the chemical supply valves such that the pure water and the plurality of liquid chemicals are present at a predetermined ratio at a meeting point where the pure water and the plurality of liquid chemicals meet.

According to the above-described embodiment, the ratio between the pure water and the liquid chemicals can be constant from the start of supply of the cleaning liquid into the cleaning liquid supply line to initiate cleaning. The pure water and the liquid chemicals, contained in the cleaning liquid, are uniformly mixed when the cleaning liquid flows in the cleaning liquid supply line.

In a preferred embodiment of the present invention, the plurality of liquid chemicals comprise ammonia water and a hydrogen peroxide solution, and the plurality of chemical supply lines comprise an ammonia water supply line and a hydrogen peroxide solution supply line.

According to the above-described embodiment, an SC-1 cleaning liquid comprising ammonia water and a hydrogen peroxide solution, diluted with pure water to a predetermined concentration, is produced.

In a preferred embodiment of the present invention, the merging line has three fluid inlets and one fluid outlet, and the pure water supply line, the ammonia water supply line, and the hydrogen peroxide solution supply line are coupled to the three fluid inlets, respectively, and the cleaning liquid supply line is coupled to the fluid outlet.

According to this embodiment, the pure water, the ammonia water and the hydrogen peroxide solution can join at the meeting point in the merging line, and the resulting cleaning liquid can be smoothly introduced into the cleaning liquid supply line.

In a preferred embodiment of the present invention, the cleaning liquid supply line is provided with a line mixer configured to agitate the cleaning liquid flowing in the cleaning liquid supply line.

Even if the cleaning liquid supply line is short, the pure water and the liquid chemicals, contained in the cleaning liquid flowing in the cleaning liquid supply line, can be forcibly mixed by the line mixer.

A second embodiment of the present invention provides a substrate cleaning method of cleaning a substrate by supplying a cleaning liquid, containing a plurality of liquid chemicals diluted with pure water, to the substrate, said method comprising: forming a cleaning liquid by causing pure water with a regulated flow rate and a plurality of liquid chemicals with regulated flow rates to meet such that the pure water and the plurality of liquid chemicals are present at a predetermined ratio at a meeting point where the pure water and the plurality of liquid chemicals meet; and delivering the cleaning liquid to a substrate.

According to the present invention, the ratio between the pure water and the several kinds of liquid chemicals can be constant from the start of supply of the cleaning liquid into the cleaning liquid supply line to initiate cleaning of the substrate. In addition, the pure water and the liquid chemicals, contained in the cleaning liquid, can be uniformly mixed when the cleaning liquid flows in the cleaning liquid supply line before the cleaning liquid is supplied to the substrate. Thus, the present invention, with the use of a tankless in-line apparatus, makes it possible to clean a substrate by continuously supplying a cleaning liquid, comprising pure water and a plurality of liquid chemicals, to the substrate while keeping the components of the cleaning liquid uniformly mixed at a constant ratio from the start of cleaning of the substrate.

DETAILED DESCRIPTION OF EMBODIMENTS

Embodiments of the present invention will now be described with reference to the drawings.

Figure 1:
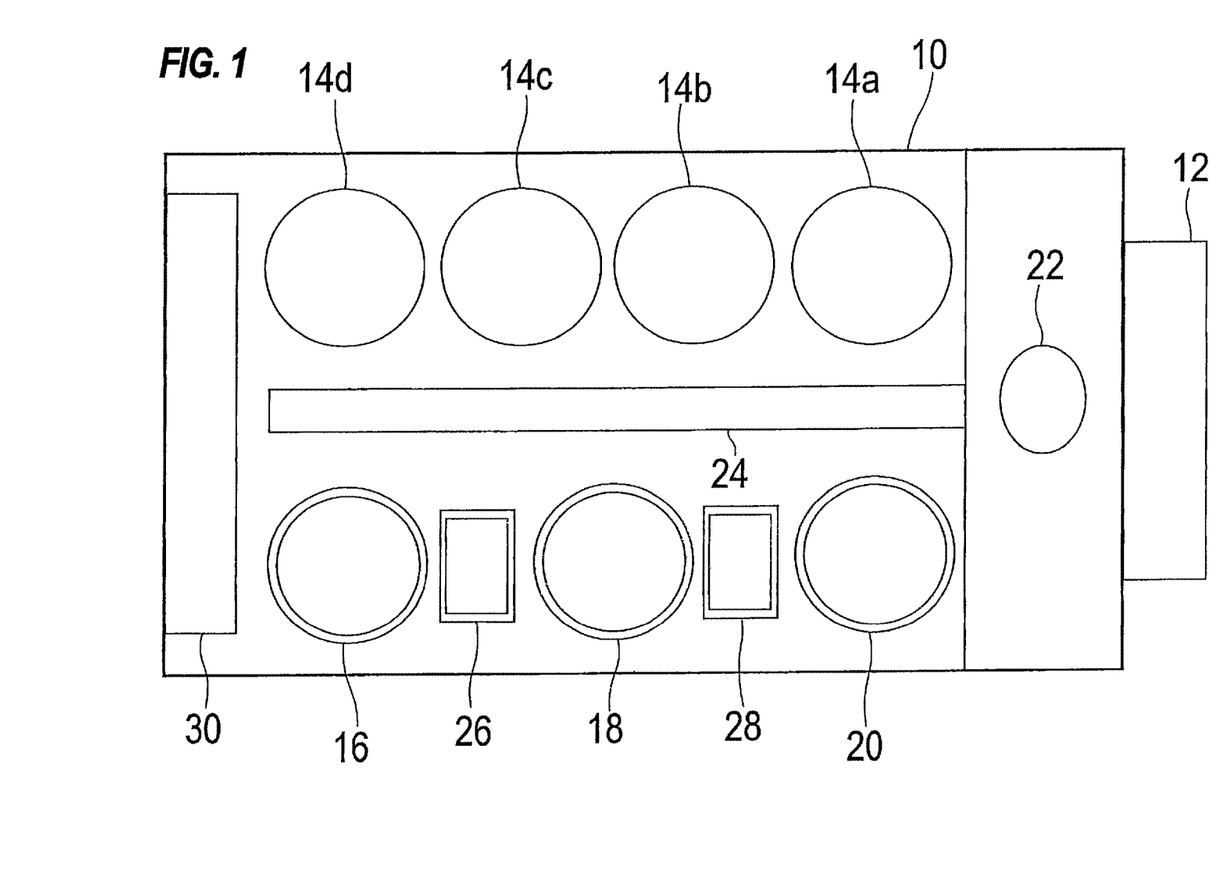
FIG. 1 is a plan view showing an overall construction a polishing apparatus provided with a substrate cleaning apparatus according to an embodiment of the present invention.

FIG. 1 is a plan view showing the overall construction a polishing apparatus incorporating a substrate cleaning apparatus according to an embodiment of the present invention. As shown in FIG. 1, the polishing apparatus includes an approximately-rectangular housing 10, and a loading port 12 for placing thereon a substrate cassette for housing therein a large number of substrates, such as semiconductor wafers. The loading port 12 is disposed adjacent to the housing 10. The loading port 12 can be mounted with an open cassette, a SMIF (Standard Manufacturing Interface), or a FOUP (Front Opening Unified Pod). SMIF and FOUP are each an airtight container which houses a substrate cassette therein and which, by covering it with a partition wall, can isolate its internal environment from an external environment.

In the housing 10 are provided a plurality of (e.g., four as illustrated) polishing units 14a to 14d, a first cleaning unit 16, constituting a substrate cleaning apparatus according to an embodiment of the present invention, for performing primary cleaning (rough cleaning) of a polished substrate, a second cleaning unit 18 for performing secondary cleaning (finish cleaning) of the substrate, and a drying unit 20 for drying the cleaned substrate. The polishing units 14a to 14d are arranged in the longitudinal direction of the polishing apparatus, and the cleaning units 16, 18 and the drying unit 20 are also arranged in the longitudinal direction of the polishing apparatus.

A first substrate transport robot 22 is disposed in an area surrounded by the loading port 12, the polishing unit 14a and the drying unit 20. Further, a substrate transport unit 24 is disposed parallel to the arrangement direction of the polishing units 14a to 14d. The first substrate transport robot 22 receives a substrate to be polished from the loading port 12 and transports the substrate to the substrate transport unit 24, and receives a dried substrate from the drying unit 20 and returns the dried substrate to the loading port 12. The substrate transport unit 24 transports a substrate after receiving it from the first substrate transport robot 22, and transports the substrate between the polishing units 14a to 14d.

Between the first cleaning unit 16 and the second cleaning unit 18 is disposed a second substrate transport robot 26 for transporting a substrate between the cleaning units 16, 18. Further, between the second cleaning unit 18 and the drying unit 20 is disposed a third substrate transport robot 28 for transporting a substrate between the units 18, 20.

A controller 30 for controlling operations of the units and devices of the polishing apparatus is disposed in the housing 10. For example, the controller 30 controls the below-described flow regulators 56a to 56c and supply valves 58a to 58c.

Figure 2:
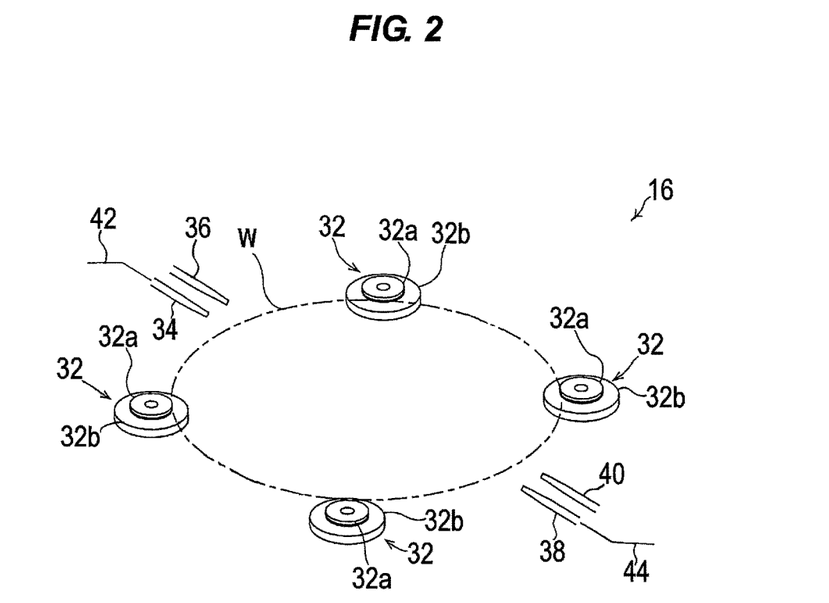
FIG. 2 is a perspective view schematically showing a first cleaning unit constituting a substrate cleaning apparatus according to an embodiment of the present invention.

FIG. 2 is a perspective view showing the first cleaning unit 16 constituting a substrate cleaning apparatus according to an embodiment of the present invention. As shown in FIG. 2, the first cleaning unit (i.e., the substrate cleaning apparatus) 16 includes four rollers (or a substrate holder) 32 for horizontally holding and rotating a substrate W with its front surface facing upward, an upper cleaning liquid supply nozzle 34 and an upper rinsing liquid supply nozzle 36 for supplying a cleaning liquid and a rinsing liquid, respectively, to the front surface (upper surface) of the rotating substrate W held by the four rollers 32, and a lower cleaning liquid supply nozzle 38 and a lower rinsing liquid supply nozzle 40 for supplying a cleaning liquid and a rinsing liquid, respectively, to a back surface (lower surface) of the rotating substrate W held by the four rollers 32. The rollers 32 are configured to be moveable in directions closer to and away from each other by means of a not-shown drive mechanism (e.g., an air cylinder). The upper cleaning liquid supply nozzle 34 is coupled to an upper cleaning liquid supply line 42, and the lower cleaning liquid supply nozzle 38 is coupled to a lower cleaning liquid supply line 44.

Each roller 32 has a two-stage structure constituted by a holding portion 32a and a shoulder portion (support portion) 32b. The diameter of the shoulder portion 32b is larger than the diameter of the holding portion 32a, and the holding portion 32a is formed on the shoulder portion 32b. The substrate W is first placed on the shoulder portions 32b, and then the rollers 32 are moved toward the substrate W to hold the substrate W with the holding portions 32a. At least one of the four rollers 32 is configured to be rotated by a not-shown rotating device, whereby the substrate W is rotated with its periphery held by the rollers 32. The upper surface of each shoulder portion 32b is a tapered surface which is inclined downwardly so that the substrate W is kept not in contact with the shoulder portions 32b, while the substrate W is held by the holding portions 32a.

Cleaning of the front and back surfaces of the substrate W by the first cleaning unit 16 is performed in the following manner. The substrate W, with its front surface facing upward, is horizontally held and rotated by the rollers 32. A cleaning liquid is then supplied from the cleaning liquid supply nozzles 34, 38 to the front and back surfaces of the substrate W, thereby cleaning the surfaces of the substrate W. In this embodiment an SC-1 (Standard Clean 1) cleaning liquid comprising a mixture of ammonia water and a hydrogen peroxide solution, diluted with pure water to a predetermined concentration, is used as the cleaning liquid. After the cleaning, a rinsing liquid (e.g., pure water) is supplied from the rinsing liquid supply nozzles 36, 40 to the front and back surfaces of the substrate W, thereby rinsing off the cleaning liquid (liquid chemical) remaining on the front and back surfaces of the substrate W.

The second cleaning unit 18 is a cleaning unit configured to perform finish cleaning of a substrate surface by two-fluid jet cleaning which involves ejecting two fluids, constituted by carbonated water and a carrier gas, such as $N_2$ gas, toward the substrate surface at a high speed. The drying unit 20 is a spin-drying unit for drying a substrate by emitting an IPA vapor from a moving nozzle toward the substrate which is held horizontally, followed by high-speed rotation of the substrate to further dry the substrate by a centrifugal force.

Figure 3:
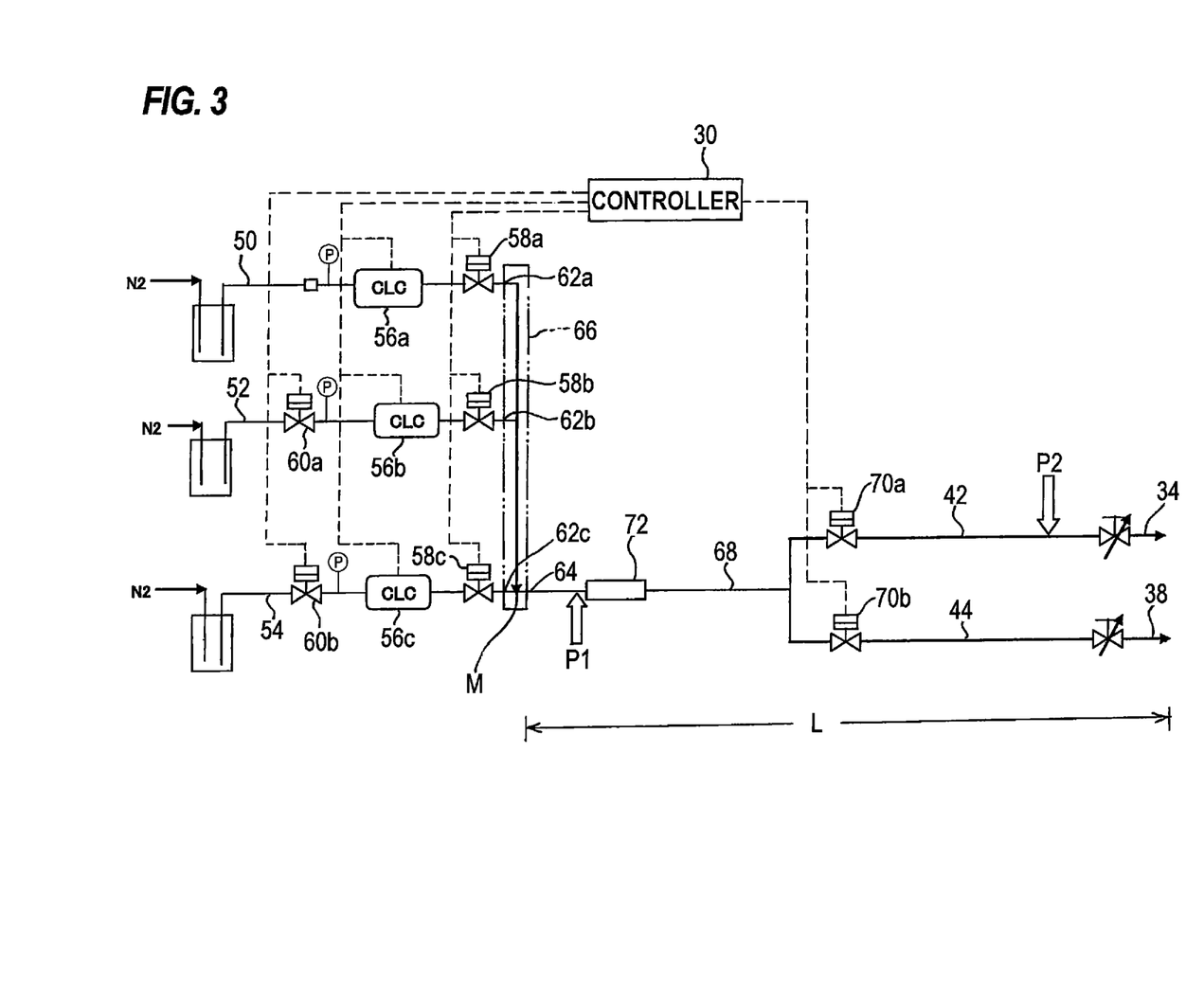
FIG. 3 is a schematic view of a cleaning liquid supply mechanism provided in the first cleaning unit shown in FIG. 2.

FIG. 3 is a schematic view of a cleaning liquid supply mechanism for producing a cleaning liquid containing different kinds of liquid chemicals, diluted with pure water, and supplying the cleaning liquid to the cleaning liquid supply nozzles 34, 38. In this embodiment, ammonia water (NH$_4$OH) and a hydrogen peroxide solution (H$_2$O$_2$) are used as the different kinds of liquid chemicals to produce the SC-1 cleaning liquid comprising the ammonia water and the hydrogen peroxide solution, diluted with pure water (DIW). It is also possible to use hydrochloric acid and a hydrogen peroxide solution as the different kinds of liquid chemicals to produce an SC-2 cleaning liquid comprising the hydrochloric acid and the hydrogen peroxide solution, diluted with pure water. It is, of course, possible to produce a cleaning liquid comprising two or more kinds of liquid chemicals, diluted with pure water.

As shown in FIG. 3, the cleaning liquid supply mechanism includes a pure water supply line 50 for supplying pure water, an ammonia water supply line (a first chemical supply line) 52 for supplying 29% ammonia water (a first chemical), and a hydrogen peroxide solution supply line (a second chemical supply line) 54 for supplying a 30% hydrogen peroxide solution (a second chemical). The 29% ammonia water and the 30% hydrogen peroxide solution are merely examples of the first chemical and the second chemical, and the present invention is not limited to the use of the particular liquid chemicals in this embodiment.

The pure water supply line 50 is provided with a flow regulator (a pure water flow regulator) 56a for regulating a flow rate of the pure water flowing in the pure water supply line 50, and a supply valve (a pure water supply valve) 58a installed downstream of the flow regulator 56a. A mass flow controller may be used as the flow regulator 56a. The mass flow controller that can be used for the flow regulator 56a may be configured to regulate the flow rate of pure water e.g., in the range of 400 to 2000 ml/min by a closed-loop control.

The ammonia water supply line 52 is provided with a flow regulator (a first chemical flow regulator) 56b for regulating a flow rate of ammonia water flowing in the ammonia water supply line 52, a main valve 60a installed upstream of the flow regulator 56b, and a supply valve (a first chemical supply valve) 58b installed downstream of the flow regulator 56b. A mass flow controller may be used as the flow regulator 56b. The mass flow controller that can be used for the flow regulator 56b may be configured to regulate the flow rate of ammonia water e.g., in the range of 20 to 100 ml/min by a closed-loop control.

The hydrogen peroxide solution supply line 54 is provided with a flow regulator (a second chemical flow regulator) 56c for regulating a flow rate of the hydrogen peroxide solution flowing in the hydrogen peroxide solution supply line 54, a main valve 60b installed upstream of the flow regulator 56c, and a supply valve (a second chemical supply valve) 58c installed downstream of the flow regulator 56c. A mass flow controller may be used as the flow regulator 56c. The mass flow controller that can be used for the flow regulator 56c may be configured to regulate the flow rate of the hydrogen peroxide solution e.g., in the range of 20 to 100 ml/min by a closed-loop control.

The cleaning liquid supply mechanism further includes a merging line 66 having three fluid inlets 62a, 62b, 62c and one fluid outlet 64. The pure water supply line 50, the ammonia water supply line 52 and the hydrogen peroxide solution supply line 54 are connected to the fluid inlets 62a, 62b and 62c, respectively. A cleaning liquid supply line 68 is connected to the fluid outlet 64 of the merging line 66. A four-way valve, a collecting pipe, etc. may be used as the merging line 66.

The pure water, with its flow rate regulated by the flow regulator 56a, flows into the merging line 66 when the supply valve 58a of the pure water supply line 50 is opened. The ammonia water, with its flow rate regulated by the flow regulator 56b, flows into the merging line 66 when the supply valve 58b of the ammonia water supply line 52 is opened with the main valve 60a opened in advance. The hydrogen peroxide solution, with its flow rate regulated by the flow regulator 56c, flows into the merging line 66 when the supply valve 58c of the hydrogen peroxide solution supply line 54 is opened with the main valve 60b opened in advance. The pure water, the ammonia water and the hydrogen peroxide solution, which have flowed into the merging line 66, meet at a meeting point M and are mixed with each other to form a cleaning liquid. This cleaning liquid flows through the cleaning liquid supply line 68. The pure water, the ammonia water and the hydrogen peroxide solution, contained in the cleaning liquid, become uniformly mixed while the cleaning liquid flows in the cleaning liquid supply line 68.

The cleaning liquid supply line 68 branches into an upper cleaning liquid supply line 42 and a lower cleaning liquid supply line 44. An on-off valve 70a is installed in the upper cleaning liquid supply line 42, and an on-off valve 70b is installed in the lower cleaning liquid supply line 44. The upper cleaning liquid supply line 42 is connected to the upper cleaning liquid supply nozzle 34, and the lower cleaning liquid supply line 44 is connected to the lower cleaning liquid supply nozzle 38.

In this embodiment, a total length L, which is the sum of the cleaning liquid supply line 68 and the upper cleaning liquid supply line 42 or the lower cleaning liquid supply line 44, is 3700 mm.

The cleaning liquid supply line 68 is provided with a line mixer 72 for agitating the cleaning liquid flowing in the cleaning liquid supply line 68. The line mixer 72 can uniformly mix the pure water, the ammonia water and the hydrogen peroxide solution even if the cleaning liquid supply line 68 is not long enough for the pure water, the ammonia water and the hydrogen peroxide solution to be uniformly mixed.

The flow regulator 56a and the supply valve 58a of the pure water supply line 50, the flow regulator 56b and the supply valve 58b of the ammonia water supply line 52, and the flow regulator 56c and the supply valve 58c of the hydrogen peroxide solution supply line 54 are controlled by signals from the controller 30 such that the pure water, the ammonia water and the hydrogen peroxide solution are present at a predetermined ratio at the meeting point M where they meet in the merging line 66. For example, the flow regulator 56a and the supply valve 58a, the flow regulator 56b and the supply valve 58b, and the flow regulator 56c and the supply valve 58c are controlled such that a volume ratio between the pure water, the ammonia water and the hydrogen peroxide solution is 1960:20:20. In this case, a target concentration of the ammonia water is 0.29 vol %, and a target concentration of the hydrogen peroxide solution is 0.3 vol %. The operations of the main valves 60a, 60b and the on-off valves 70a, 70b are controlled by signals from the controller 30 as well.

Figure 4:
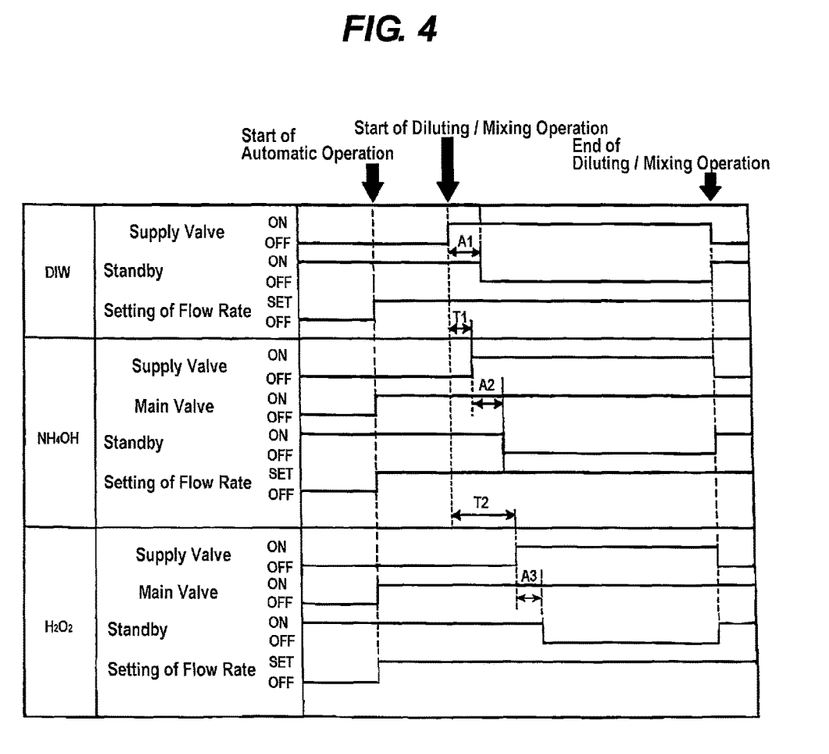
FIG. 4 is a time chart showing an example of control in automatic operation of the polishing apparatus.

FIG. 4 is a time chart showing an example of control in automatic operation of the polishing apparatus. In FIG. 4 and below-described FIGS. 5 through 10, DIW, NH$_4$OH and H$_2$O$_2$ represent the pure water, the ammonia water and the hydrogen peroxide solution, respectively.

As shown in FIG. 4, the supply valves 58a, 58b, 58c are in a standby-ON state before the automatic operation is started. "Standby-ON state" refers to a state in which the supply valves 58a, 58b, 58c are closed while waiting for the start of a diluting and mixing operation. When the automatic operation is started, the flow rate of the pure water flowing in the pure water supply line 50 is set e.g., to 1960 ml/sec by the flow regulator 56a, the flow rate of the ammonia water flowing in the ammonia water supply line 52 is set e.g., to 20 ml/sec by the flow regulator 56b, and the flow rate of the hydrogen peroxide solution flowing in the hydrogen peroxide solution supply line 54 is set e.g., to 20 ml/sec by the flow regulator 56c. Further, the main valves 60a, 60b are opened upon the start of the automatic operation.

In the pure water supply line 50, the supply valve 58a is opened at the same time the diluting and mixing operation is started, so that the pure water flows through the pure water supply line 50 into the merging line 66. The supply valve 58a turns to a standby-OFF state when a predetermined standby delay time A1 (e.g., 0.5 seconds) has elapsed from the start of the diluting and mixing operation. The "standby-OFF state" refers to a state in which the supply valve 58a is opened after the start of the diluting and mixing operation. The same holds true for the below-described standby-OFF state of the supply valves 58b, 58c.

In the ammonia water supply line 52, the supply valve 58b is opened when a predetermined opening delay time T1 (0.2 seconds in this embodiment) has elapsed from the start of the diluting and mixing operation, so that the ammonia water flows through the ammonia water supply line 52 into the merging line 66. The supply valve 58b turns to a standby-OFF state when a predetermined standby delay time A2 (e.g., 0.5 seconds) has elapsed from the start of the diluting and mixing operation.

In the hydrogen peroxide solution supply line 54, the supply valve 58c is opened when a predetermined opening delay time T2 (0.6 seconds in this embodiment) has elapsed from the start of the diluting and mixing operation, so that the hydrogen peroxide solution flows through the hydrogen peroxide solution supply line 54 into the merging line 66. The supply valve 58c turns to a standby-OFF state when a predetermined standby delay time A3 (e.g., 0.5 seconds) has elapsed from the start of the diluting and mixing operation.

When the diluting and mixing operation is terminated, all the supply valves 58a to 58c are closed into the standby-ON state.

By the above-discussed steps of opening the supply valve 58a of the pure water supply line 50 simultaneously with the start of the diluting and mixing operation, opening the supply valve 58b of the ammonia water supply line 52 when the 0.2-second opening delay time has elapsed from the start of the diluting and mixing operation, and opening the supply valve 58c of the hydrogen peroxide solution supply line 54 when the 0.6-second opening delay time has elapsed from the start of the diluting and mixing operation, the volume ratio between the pure water, the ammonia water and the hydrogen peroxide solution can be adjusted to a predetermined ratio, i.e., the volume ratio of 1960:20:20.

The opening delay time T1 between the supply valve 58a and the supply valve 58b and the opening delay time T2 between the supply valve 58a and the supply valve 58c are predetermined base on various factors, such as the flow rates of the pure water and the chemicals, the distance between the supply valve 58a and the meeting point M, the distance between the supply valve 58b and the meeting point M, the distance between the supply valve 58c and the meeting point M.

Figure 5A:
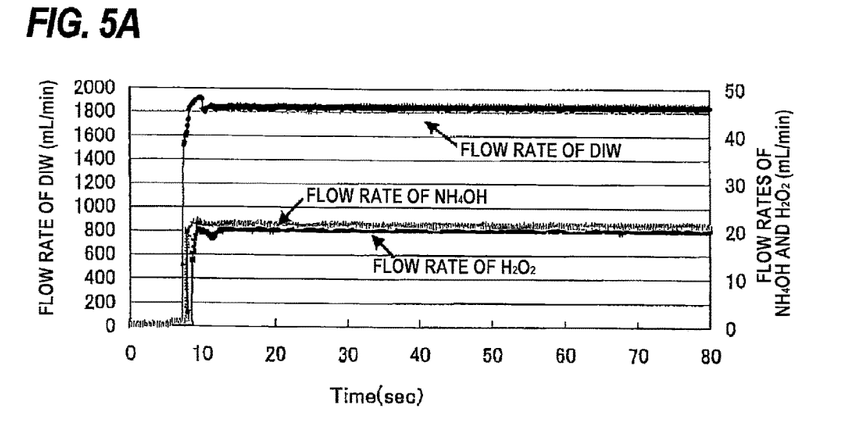
FIG. 5A is a graph showing a relationship between time and flow rate of pure water (DIW), ammonia water ($NH_4OH$) and a hydrogen peroxide solution ($H_2O_2$), as observed at a point P1 shown in FIG. 3 when an opening delay time of a supply valve in an ammonia water supply line is set to 0.2 seconds, and an opening delay time of a supply valve in a hydrogen peroxide solution supply line is set to 0.6 seconds.
Figure 5B:
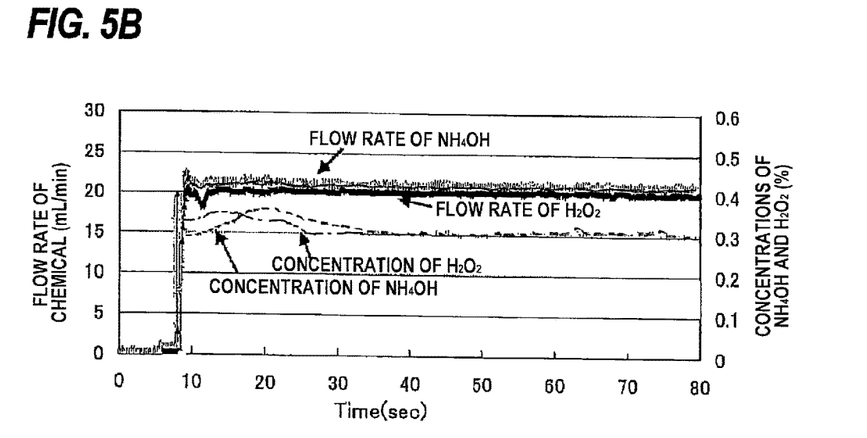
FIG. 5B is a graph showing a relationship between time and flow rate of the ammonia water and the hydrogen peroxide solution as well as a relationship between time and concentration of the ammonia water and the hydrogen peroxide solution.

FIG. 5A shows the relationship between time and the flow rates of the pure water, the ammonia water and the hydrogen peroxide solution, as observed at a point P1 located near the fluid outlet of the merging line 66 shown in FIG. 3, when the opening delay time T1 of the supply valve 58b of the ammonia water supply line 52 is set to 0.2 seconds (T1=0.2 seconds), and the opening delay time T2 of the supply valve 58c of the hydrogen peroxide solution supply line 54 is set to 0.6 seconds (T2=0.6 seconds). FIG. 5B shows the relationship between time and the flow rates of the ammonia water and the hydrogen peroxide solution as well as the relationship between time and the concentrations of the ammonia water and the hydrogen peroxide solution.

Figure 6A:
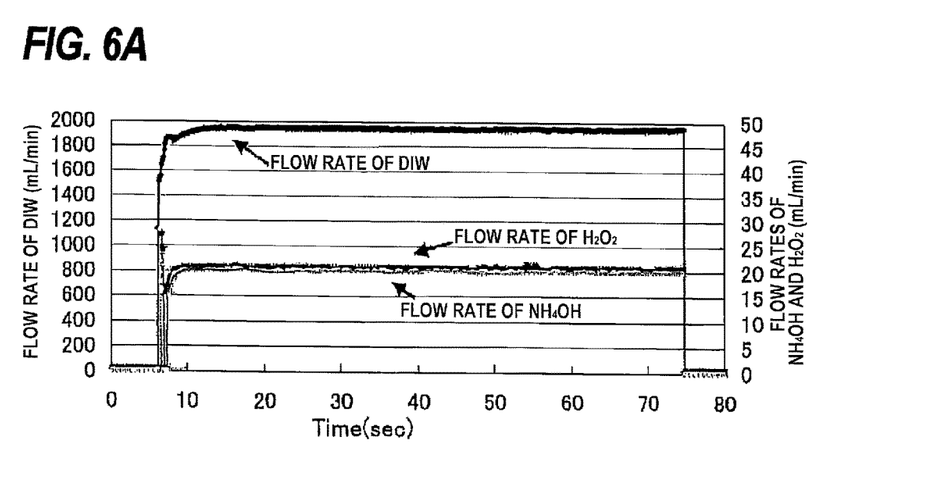
FIG. 6A is a graph showing a relationship between time and flow rate of the pure water (DIW), the ammonia water ($NH_4OH$) and the hydrogen peroxide solution ($H_2O_2$), as observed at a point P2 shown in FIG. 3 when the opening delay time of the supply valve in the ammonia water supply line is set to 0.2 seconds, and the opening delay time of the supply valve in the hydrogen peroxide solution supply line is set to 0.6 seconds.
Figure 6B:
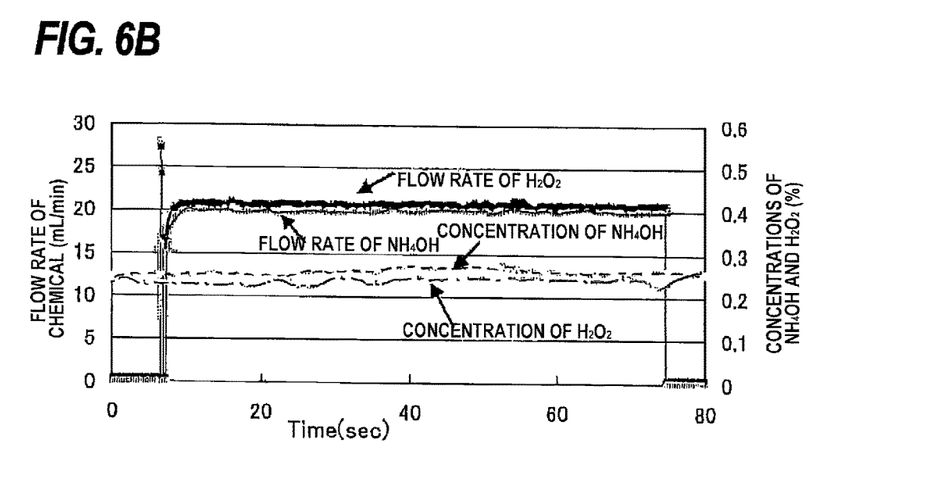
FIG. 6B is a graph showing a relationship between time and flow rate of the ammonia water and the hydrogen peroxide solution as well as a relationship between time and concentration of the ammonia water and the hydrogen peroxide solution.

FIG. 6A shows the relationship between time and the flow rates of the pure water, the ammonia water and the hydrogen peroxide solution, as observed at a point P2 located near the inlet of the upper cleaning liquid supply nozzle 34 shown in FIG. 3, when the opening delay time T1 of the supply valve 58b of the ammonia water supply line 52 is set to 0.2 seconds (T1=0.2 seconds), and the opening delay time T2 of the supply valve 58c of the hydrogen peroxide solution supply line 54 is set to 0.6 seconds (T2=0.6 seconds). FIG. 6B shows the relationship between time and the flow rates of the ammonia water and the hydrogen peroxide solution as well as the relationship between time and the concentrations of the ammonia water and the hydrogen peroxide solution.

The data in FIGS. 5A through 6B demonstrates that the ratio between the pure water, the ammonia water and the hydrogen peroxide solution becomes approximately constant from the start of the diluting and mixing operation, and that the concentrations gradually become stable, although the concentrations of the ammonia water and the hydrogen peroxide solution temporarily rise at the point P1.

Figure 7A:
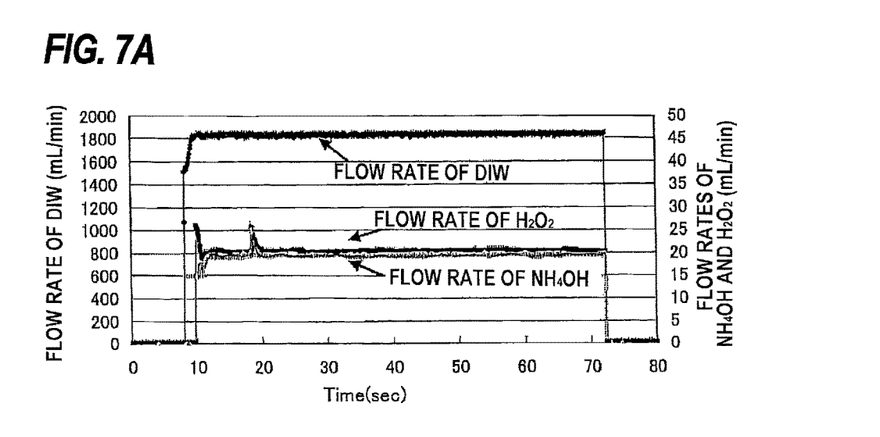
FIG. 7A is a graph showing a relationship between time and flow rate of the pure water (DIW), the ammonia water ($NH_4OH$) and the hydrogen peroxide solution ($H_2O_2$), as observed at the point P1 shown in FIG. 3 when the opening delay time of the supply valve in the ammonia water supply line is set to 1.2 seconds, and the opening delay time of the supply valve in the hydrogen peroxide solution supply line is set to 1.2 seconds.
Figure 7B:
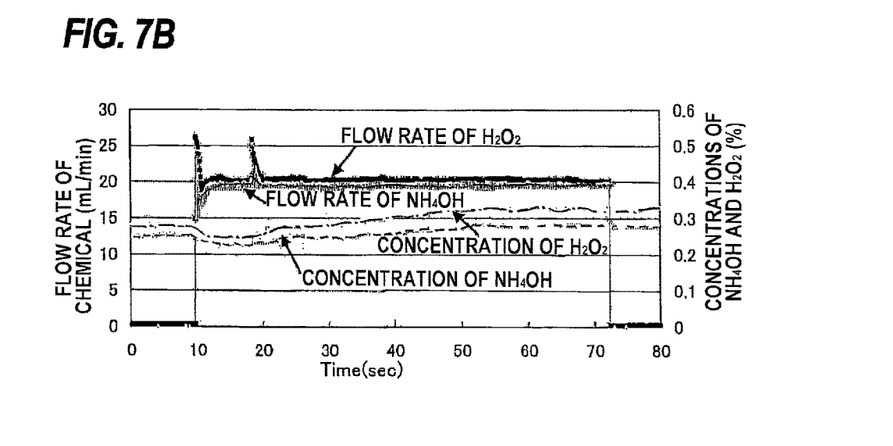
FIG. 7B is a graph showing a relationship between time and flow rate of the ammonia water and the hydrogen peroxide solution as well as a relationship between time and concentration of the ammonia water and the hydrogen peroxide solution.

FIG. 7A shows the relationship between time and the flow rates of the pure water, the ammonia water and the hydrogen peroxide solution, as observed at the point P1 located near the fluid outlet of the merging line 66 shown in FIG. 3, when the opening delay time T1 of the supply valve 58b of the ammonia water supply line 52 is set to 1.2 seconds (T1=1.2 seconds), and the opening delay time T2 of the supply valve 58c of the hydrogen peroxide solution supply line 54 is set to 1.2 seconds (T2=1.2 seconds). FIG. 7B shows the relationship between time and the flow rates of the ammonia water and the hydrogen peroxide solution as well as the relationship between time and the concentrations of the ammonia water and the hydrogen peroxide solution.

Figure 8A:
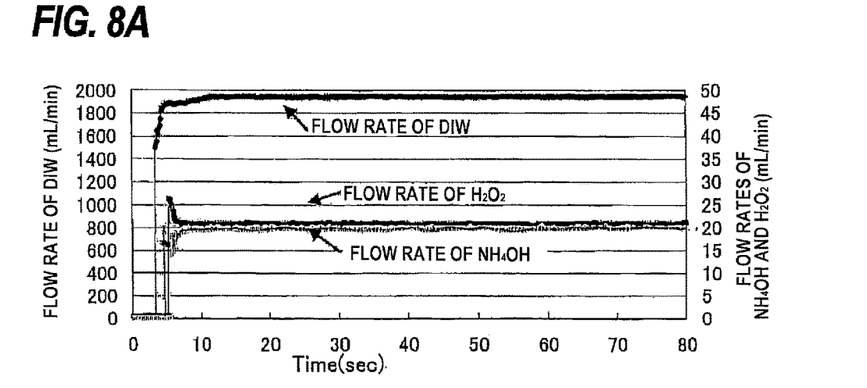
FIG. 8A is a graph showing a relationship between time and flow rate of the pure water (DIW), the ammonia water ($NH_4OH$) and the hydrogen peroxide solution ($H_2O_2$), as observed at the point P2 shown in FIG. 3 when the opening delay time of the supply valve in the ammonia water supply line is set to 1.2 seconds, and the opening delay time of the supply valve in the hydrogen peroxide solution supply line is set to 1.2 seconds.
Figure 8B:
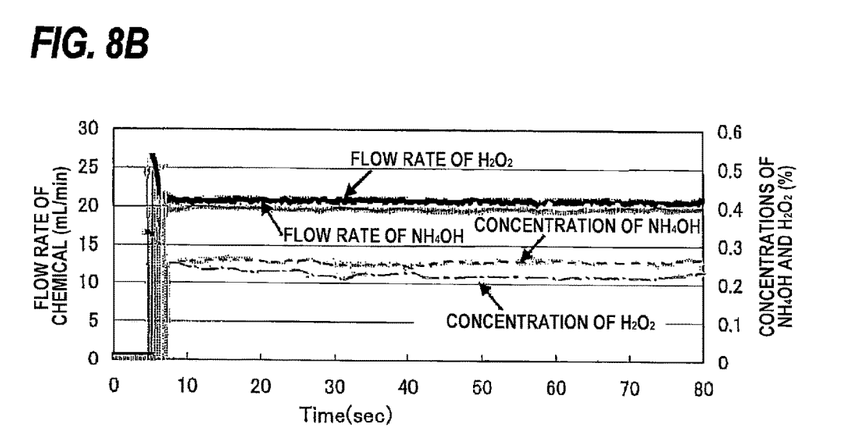
FIG. 8B is a graph showing a relationship between time and flow rate of the ammonia water and the hydrogen peroxide solution as well as a relationship between time and concentration of the ammonia water and the hydrogen peroxide solution.

FIG. 8A shows the relationship between time and the flow rates of the pure water, the ammonia water and the hydrogen peroxide solution, as observed at the point P2 located near the inlet of the upper cleaning liquid supply nozzle 34 shown in FIG. 3, when the opening delay time T1 of the supply valve 58b of the ammonia water supply line 52 is set to 1.2 seconds (T1=1.2 seconds), and the opening delay time T2 of the supply valve 58c of the hydrogen peroxide solution supply line 54 is set to 1.2 seconds (T2=1.2 seconds). FIG. 8B shows the relationship between time and the flow rates of the ammonia water and the hydrogen peroxide solution as well as the relationship between time and the concentrations of the ammonia water and the hydrogen peroxide solution.

The data in FIGS. 7A through 8B demonstrates that there is a considerable change in the ratio between the pure water, the ammonia water and the hydrogen peroxide solution which occurs immediately after the start of the diluting and mixing operation, and that the concentrations of the ammonia water and the hydrogen peroxide solution increase with time.

Figure 9A:
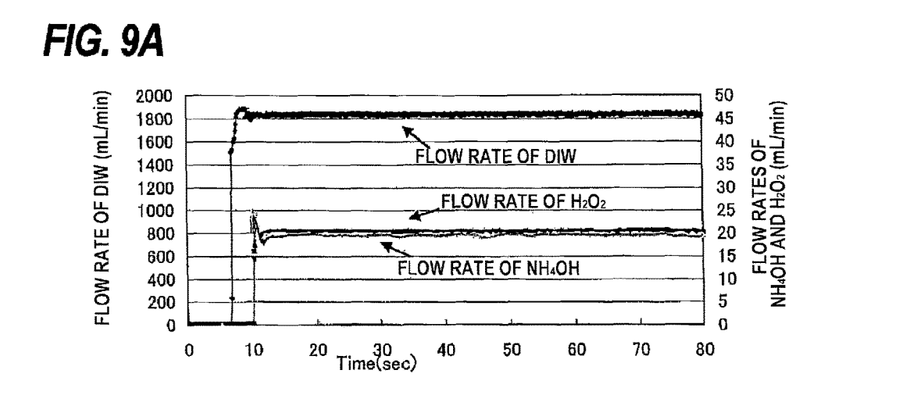
FIG. 9A is a graph showing a relationship between time and flow rate of the pure water (DIW), the ammonia water ($NH_4OH$) and the hydrogen peroxide solution ($H_2O_2$), as observed at the point P1 shown in FIG. 3 when the opening delay time of the supply valve in the ammonia water supply line is set to 3 seconds, and the opening delay time of the supply valve in the hydrogen peroxide solution supply line is set to 3 seconds.
Figure 9B:
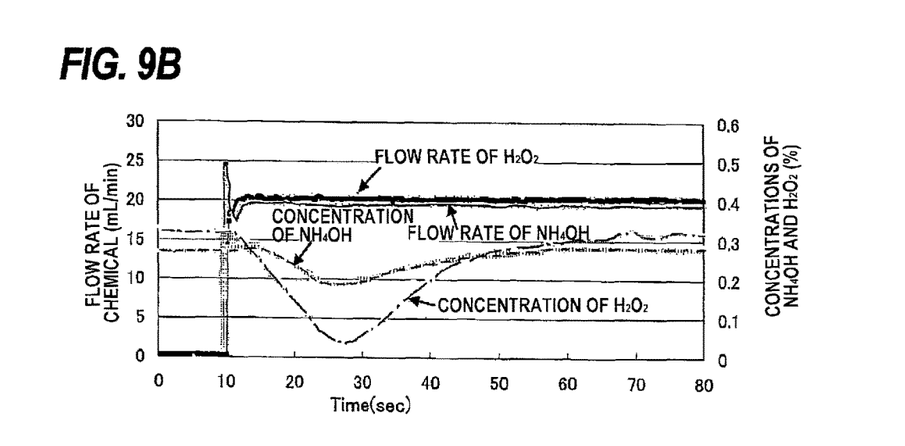
FIG. 9B is a graph showing a relationship between time and flow rate of the ammonia water and the hydrogen peroxide solution as well as a relationship between time and concentration of the ammonia water and the hydrogen peroxide solution.

FIG. 9A shows the relationship between time and the flow rates of the pure water, the ammonia water and the hydrogen peroxide solution, as observed at the point P1 located near the fluid outlet of the merging line 66 shown in FIG. 3, when the opening delay time T1 of the supply valve 58b of the ammonia water supply line 52 is set to 3 seconds (T1=3 seconds), and the opening delay time T2 of the supply valve 58c of the hydrogen peroxide solution supply line 54 is set to 3 seconds (T2=3 seconds). FIG. 9B shows the relationship between time and the flow rates of the ammonia water and the hydrogen peroxide solution as well as the relationship between time and the concentrations of the ammonia water and the hydrogen peroxide solution.

Figure 10A:
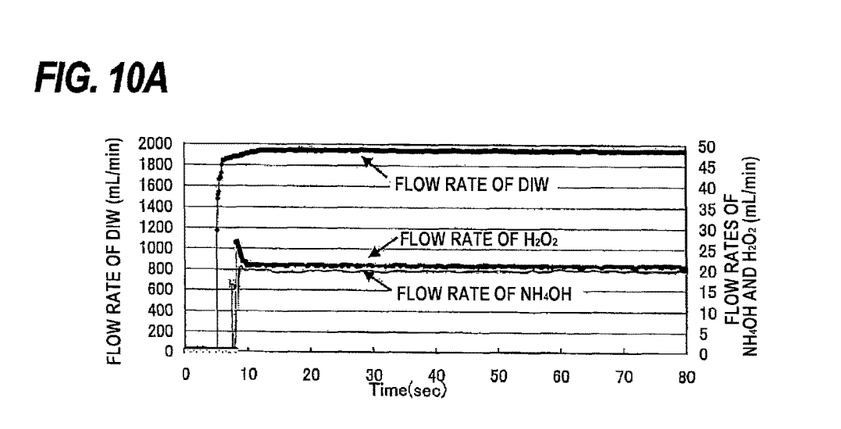
FIG. 10A is a graph showing a relationship between time and flow rate of the pure water (DIW), the ammonia water ($NH_4OH$) and the hydrogen peroxide solution ($H_2O_2$), as observed at the point P2 shown in FIG. 3 when the opening delay time of the supply valve in the ammonia water supply line is set to 3 seconds, and the opening delay time of the supply valve in the hydrogen peroxide solution supply line is set to 3 seconds.
Figure 10B:
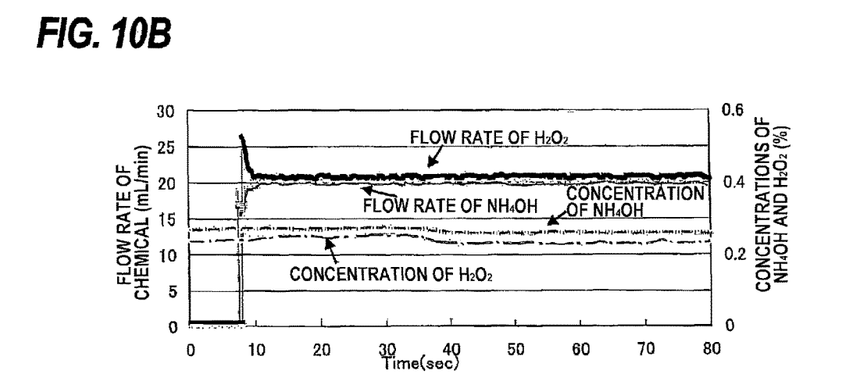
FIG. 10B is a graph showing a relationship between time and flow rate of the ammonia water and the hydrogen peroxide solution as well as a relationship between time and concentration of the ammonia water and the hydrogen peroxide solution.

FIG. 10A shows the relationship between time and the flow rates of the pure water, the ammonia water and the hydrogen peroxide solution, as observed at the point P2 located near the inlet of the upper cleaning liquid supply nozzle 34 shown in FIG. 3, when the opening delay time T1 of the supply valve 58b of the ammonia water supply line 52 is set to 3 seconds (T1=3 seconds), and the opening delay time T2 of the supply valve 58c of the hydrogen peroxide solution supply line 54 is set to 3 seconds (T2=3 seconds). FIG. 10B shows the relationship between time and the flow rates of the ammonia water and the hydrogen peroxide solution as well as the relationship between time and the concentrations of the ammonia water and the hydrogen peroxide solution.

The data in FIGS. 9A through 10B demonstrates that there is a considerable change in the ratio between the pure water, the ammonia water and the hydrogen peroxide solution which occurs immediately after the start of the diluting and mixing operation, and that the concentrations of the ammonia water and the hydrogen peroxide solution considerably change with time.

The operation of the polishing apparatus shown in FIG. 1 will now be described. First, a substrate is taken out of the substrate cassette in the loading port 12, and the substrate is transported to one of the polishing units 14a to 14d, where the front surface of the substrate is polished. The polished substrate is transported to the first cleaning unit 16.

In the first cleaning unit 16, primary cleaning (or rough cleaning) of the front and back surfaces of the substrate W is carried out by supplying the cleaning liquid (SC-1 cleaning liquid) to the front and back surfaces of the substrate W while horizontally rotating the substrate W with its front surface facing upward. Thereafter, the rinsing liquid (pure water) is supplied to the front and back surfaces of the substrate W to rinse off the cleaning liquid (liquid chemical) remaining on the surfaces of the substrate W.

After the primary cleaning, the substrate W is transported from the first cleaning unit 16 to the second cleaning unit 18. In the second cleaning unit 18, secondary cleaning (or finish cleaning) of the front surface of the substrate W with two-fluid jet is carried out by ejecting carbonated water and a carrier gas, such as $N_2$ gas, from a two-fluid nozzle toward the substrate surface at a high speed while horizontally rotating the substrate W with its front surface facing upward. Thereafter, the rinsing liquid is supplied to the front surface of the substrate W to rinse off the carbonated water remaining on the front surface of the substrate W.

After the finish cleaning, the substrate W is transported from the second cleaning unit 18 to the drying unit 20, where the substrate is spin-dried. The dried substrate is then returned to the substrate cassette in the loading port 12.

While the present invention has been described with reference to embodiments, it is understood that the present invention is not limited to the embodiments described above, and various changes and modifications can be made within the scope of the inventive concept as expressed herein.

What is claimed is:

1. A substrate cleaning apparatus for cleaning a substrate by supplying a cleaning liquid, containing a plurality of liquid chemicals diluted with pure water, to the substrate, said apparatus comprising:
   a substrate holder configured to rotate a substrate;
   a pure water supply line provided with a pure water flow regulator and a pure water supply valve;
   a first chemical supply line provided with a first chemical flow regulator and a first chemical supply valve;
   a second chemical supply line provided with a second chemical flow regulator and a second chemical supply valve;
   a merging line including a meeting point therein at which pure water flowing through the pure water supply line, a first liquid chemical flowing through the first chemical supply line, and a second liquid chemical flowing through the second chemical supply line meet to form a cleaning liquid;
   a cleaning liquid supply line coupled to the merging line;
   a cleaning liquid supply nozzle coupled to the cleaning liquid supply line and configured to supply the cleaning liquid onto the substrate; and
   a controller configured to:
   (i) open the pure water supply valve while controlling the pure water flow regulator,
   (ii) open the first chemical supply valve based on a first opening delay time that has elapsed since the pure water supply valve has been opened while controlling the first chemical flow regulator, and
   (iii) open the second chemical supply valve based on a second opening delay time that has elapsed since the pure water supply valve has been opened, while controlling the second chemical flow regulator, the second opening delay time being longer than the first opening delay time,
   wherein the first opening delay time and the second opening delay time being set such that the pure water, the first liquid chemical, and the second liquid chemical all reach the meeting point simultaneously for a first time to form the cleaning liquid and such that a ratio of flow rates of the pure water, the first liquid chemical, and the second liquid chemical in the cleaning liquid, supplied from the cleaning nozzle, is constant from a beginning of the supply of the pure water, the first liquid chemical, and the second liquid chemical from the cleaning liquid supply nozzle.

2. The substrate cleaning apparatus according to claim 1, wherein the first liquid chemical comprises ammonia water and the second liquid chemical comprises a hydrogen peroxide solution.

3. The substrate cleaning apparatus according to claim 1, wherein:
   the merging line has three fluid inlets and one fluid outlet; and
   the pure water supply line, the first chemical supply line, and the second chemical supply line are coupled to the three fluid inlets, respectively, and the cleaning liquid supply line is coupled to the fluid outlet.

4. The substrate cleaning apparatus according to claim 1, wherein the cleaning liquid supply line is provided with a line mixer configured to agitate the cleaning liquid flowing in the cleaning liquid supply line.

5. the substrate cleaning apparatus according to claim 1, wherein the pure water supply valve, the first chemical supply valve, and the second chemical supply valve are arranged along the merging line in the order of: 1) the pure water supply valve, 2) the first chemical supply valve, and 3) the second chemical supply valve.

* * * * *